United States Patent
Malone et al.

(10) Patent No.: US 11,775,004 B2
(45) Date of Patent: Oct. 3, 2023

(54) PHASE ALIGNING AND CALIBRATING CLOCKS FROM ONE PHASE LOCK LOOP (PLL) FOR A TWO-CHIP DIE MODULE

(71) Applicant: International Business Machines Corporation, Armonk, NY (US)

(72) Inventors: Douglas J. Malone, Pleasant Valley, NY (US); Andreas H. A. Arp, Nufringen (DE); Franklin M. Baez, Fishkill, NY (US); Daniel M. Dreps, Georgetown, TX (US); Jason Lee Frankel, Wappingers Falls, NY (US); Chad Andrew Marquart, Austin, TX (US); Ching Lung Tong, Highland Mills, NY (US); Lily Jielu Zhang, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 17/471,442

(22) Filed: Sep. 10, 2021

(65) Prior Publication Data
US 2023/0085155 A1   Mar. 16, 2023

(51) Int. Cl.
*G06F 1/08* (2006.01)
*G06F 1/12* (2006.01)
*H03L 7/085* (2006.01)

(52) U.S. Cl.
CPC .................. *G06F 1/12* (2013.01); *G06F 1/08* (2013.01); *H03L 7/085* (2013.01)

(58) Field of Classification Search
CPC ...................................... G06F 1/12; G06F 1/08
See application file for complete search history.

(56) References Cited

U.S. PATENT DOCUMENTS

| | | | | |
|---|---|---|---|---|
| 5,638,019 A | * | 6/1997 | Frankeny | H03L 7/0805 331/25 |
| 5,742,798 A | * | 4/1998 | Goldrian | G06F 1/10 713/400 |
| 5,964,880 A | * | 10/1999 | Liu | G06F 1/12 713/401 |
| 7,043,653 B2 | | 5/2006 | Kuhn et al. | |
| 7,206,369 B2 | | 4/2007 | Findley et al. | |
| 7,945,803 B2 | | 5/2011 | Jones et al. | |
| 8,937,491 B2 | | 1/2015 | Gaide et al. | |

(Continued)

FOREIGN PATENT DOCUMENTS

EP          3170090 A1   5/2017

OTHER PUBLICATIONS https://www.mpi-inf.mpg.de/fileadmin/inf/d1/teaching/winter20/how_to_clock/Chapter_-4_-_PLL.pdf; printed Sep. 9, 2021; pp. 6.

*Primary Examiner* — Phil K Nguyen
(74) *Attorney, Agent, or Firm* — Jeffrey Ingalls; Cantor Colburn LLP

(57) ABSTRACT

A two-chip die module with minimal chip-to-chip clock skew is provided. The two-chip die module includes a common substrate, first and second chips operably disposed on the common substrate to be communicative in parallel with one another and a single phase lock loop (PLL). The PLL is disposed within one of the first and second chips to provide a source for a common clock signal for the first and second chips. PLL signals of the PLL to the first and second chips are nearly equal and clock sample signals of the first and second chips are nearly equal.

8 Claims, 11 Drawing Sheets

(56) References Cited

U.S. PATENT DOCUMENTS

| | | | |
|---|---|---|---|
| 9,753,521 B2 | 9/2017 | Ware et al. | |
| 10,770,443 B2 | 9/2020 | Chandrasekar et al. | |
| 2002/0073389 A1* | 6/2002 | Elboim | G06F 1/10 716/134 |
| 2003/0052723 A1* | 3/2003 | Forbes | H03K 3/0315 327/295 |
| 2003/0197537 A1* | 10/2003 | Saint-Laurent | H03L 7/0816 327/165 |
| 2004/0085109 A1* | 5/2004 | Hariharan | G06F 1/10 327/165 |
| 2006/0181303 A1* | 8/2006 | Dreps | G06F 13/4072 326/29 |
| 2006/0182214 A1* | 8/2006 | Hwang | G06F 1/10 375/359 |
| 2008/0256282 A1* | 10/2008 | Guo | G06F 13/4239 710/305 |
| 2012/0146693 A1* | 6/2012 | Lee | H03L 7/0814 327/158 |
| 2014/0351616 A1* | 11/2014 | Nieh | G06F 1/10 713/322 |
| 2015/0026490 A1* | 1/2015 | Nieh | G06F 1/10 713/300 |
| 2019/0212769 A1* | 7/2019 | Carlough | G06F 1/10 |

* cited by examiner

PHASE ALIGNING AND CALIBRATING CLOCKS FROM ONE PHASE LOCK LOOP (PLL) FOR A TWO-CHIP DIE MODULE

BACKGROUND

The present invention generally relates to phase aligning and calibrating clocks and more specifically, to a method of phase aligning and calibrating clocks sourced from one phase lock loop (PLL) for a two-chip die module.

A PLL is a control system that generates an output signal whose phase is related to the phase of an input signal. There are several different types of PLLs. A simple one is an electronic circuit including a variable frequency oscillator and a phase detector in a feedback loop. The oscillator generates a periodic signal and the phase detector compares the phase of that signal with the phase of the input periodic signal, adjusting the oscillator to keep the phases matched.

Keeping the input and output phase in lock step can also imply keeping input and output frequencies the same. Consequently, in addition to synchronizing signals, a PLL can track an input frequency or it can generate a frequency that is a multiple of the input frequency. These properties are used for computer clock synchronization, demodulation, and frequency synthesis.

PLLs are widely employed in radio, telecommunications, computers and other electronic applications. They can be used to demodulate a signal, recover a signal from a noisy communication channel, generate a stable frequency at multiples of an input frequency (frequency synthesis) or distribute precisely timed clock pulses in digital logic circuits, such as microprocessors.

SUMMARY

Embodiments of the present invention are directed to a two-chip die module with minimal chip-to-chip clock skew.

A non-limiting example includes a common substrate, first and second chips operably disposed on the common substrate to be communicative in parallel with one another and a single phase lock loop (PLL). The PLL is disposed within one of the first and second chips to provide a source for a common clock signal for the first and second chips. PLL signals of the PLL to the first and second chips are nearly equal and clock sample signals of the first and second chips are nearly equal.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
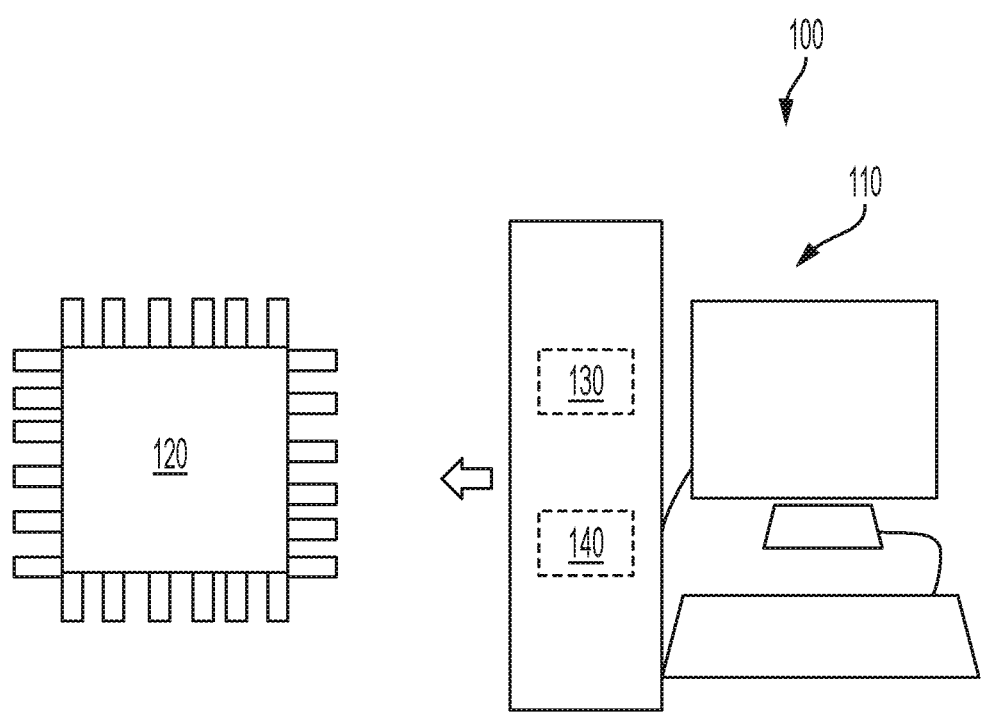
FIG. 1 illustrates a system to perform a computer-implemented method of chip design in accordance with one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide for functional circuit elements, a clock distribution topology and a test method for determining placements of clock edges in such a way as to minimize chip-to-chip clock skew effects on a high-speed interface of a two-chip die module. The two-chip die module has circuit functions for measurement and detection of clock phases, independent programming of clock distribution latency and a built-in self-test (BIST) engine for data pattern generation and error checking. As used herein, clock distribution latency refers to the delay through the clock distribution network from the PLL to the clock grid. The test method described herein will allow for quantifying and nulling out clock skew due to the components of the two-chip die module.

Package technologies with high bandwidth and high-density chip-to-chip interconnects are currently in development and slated to be operational with synchronous phase aligned clocking schemes to minimize chip-to-chip data latencies. The clock distribution network latencies on each interconnected chip are subject to variations due to chip processing, power supply setpoint differences, power supply variations due to different chip processing workloads and package signal propagation asymmetries. These components will cause clock skew between the launch and capture clocks for the latch/driver and latch/receiver pairs and will impact latch setup and hold timing margins.

This phenomenon can happen on a two-chip die module where a clock2 signal on chip2 arrives at its launch and capture latch later than the corresponding clock1 signal on chip1 with a corresponding skew in clock timing. In this case, a chip1 capture latch setup time margin is compromised by a delayed data launch from chip2 (i.e., by a TDelay2), which is due to clock1-to-clock2 skew. Similarly, the chip2 capture latch hold time margin is reduced due to clock1 on chip1 launching data early (i.e., by a TDelay1), potentially arriving too soon after clock2 leading edge switches.

Thus, a method to calibrate the arrival times of the launch and capture clocks on both chips is required to minimize the effects of clock skew on the chip-to-chip timing margins.

One or more embodiments of the present invention address one or more of the above-described shortcomings of the prior art by providing for a method to calibrate the arrival times of the launch and capture clocks on both chips is required to minimize the effects of clock skew on the chip-to-chip timing margins.

FIG. 1 is a block diagram of a system 100 to perform a computer-implemented method of updating branch prediction according to embodiments of the invention. The system 100 includes processing circuitry 110 used to generate the design that is ultimately fabricated into an integrated circuit 120. The steps involved in the fabrication of the integrated circuit 120 are well-known and briefly described herein. Once the physical layout is finalized, according to embodiments of the invention, to facilitate optimization of the routing plan, the finalized physical layout is provided to a foundry. Masks are generated for each layer of the integrated circuit based on the finalized physical layout. Then, the wafer is processed in the sequence of the mask order. The processing includes photolithography and etch. This is further discussed with reference to FIG. 9.

Figure 2:
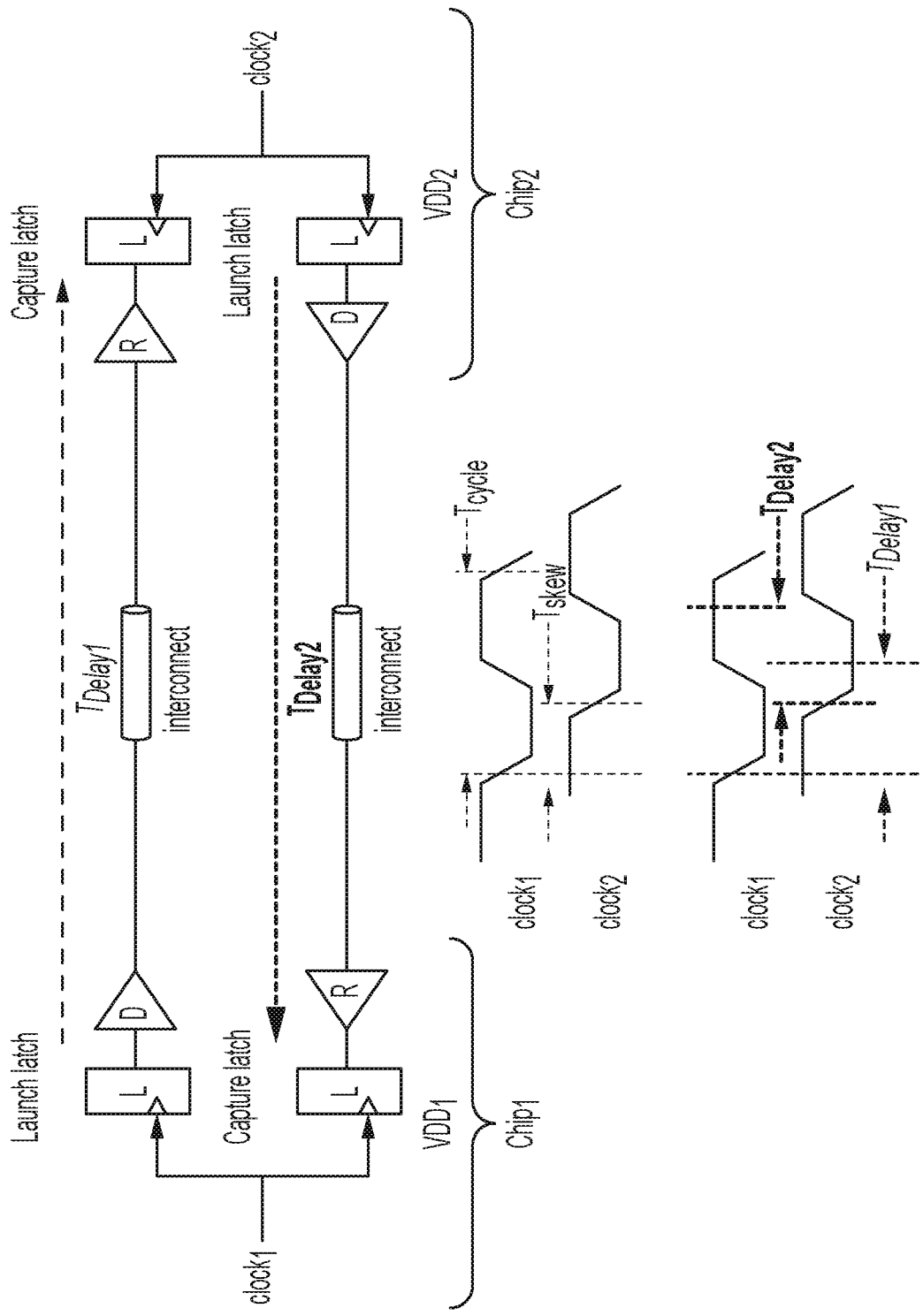
FIG. 2 is a functional block diagram of chip-to-chip parallel interconnects in accordance with one or more embodiments of the present invention.

With reference to FIG. 2, chip1 and chip2 are provided. The clock2 signal on chip2 arrives at its launch and capture latch later than the corresponding clock1 on chip1. This results in Tskew. In this case, the capture latch setup time margin of chip1 is compromised by delayed data launch from chip2, TDelay2, which is due to clock1-to-clock2 skew. Similarly, the chip2 capture latch hold time margin is reduced due to clock1 on chip1 launching data early, TDelay1, and potentially arriving too soon after clock2 leading edge switches. Thus, in accordance with one or more embodiments of the present invention, a method to calibrate the arrival times of the launch and capture clocks on both chips of a two-chip die module is provided to minimize the effects of clock skew on the chip-to-chip timing margins.

Figure 3A:
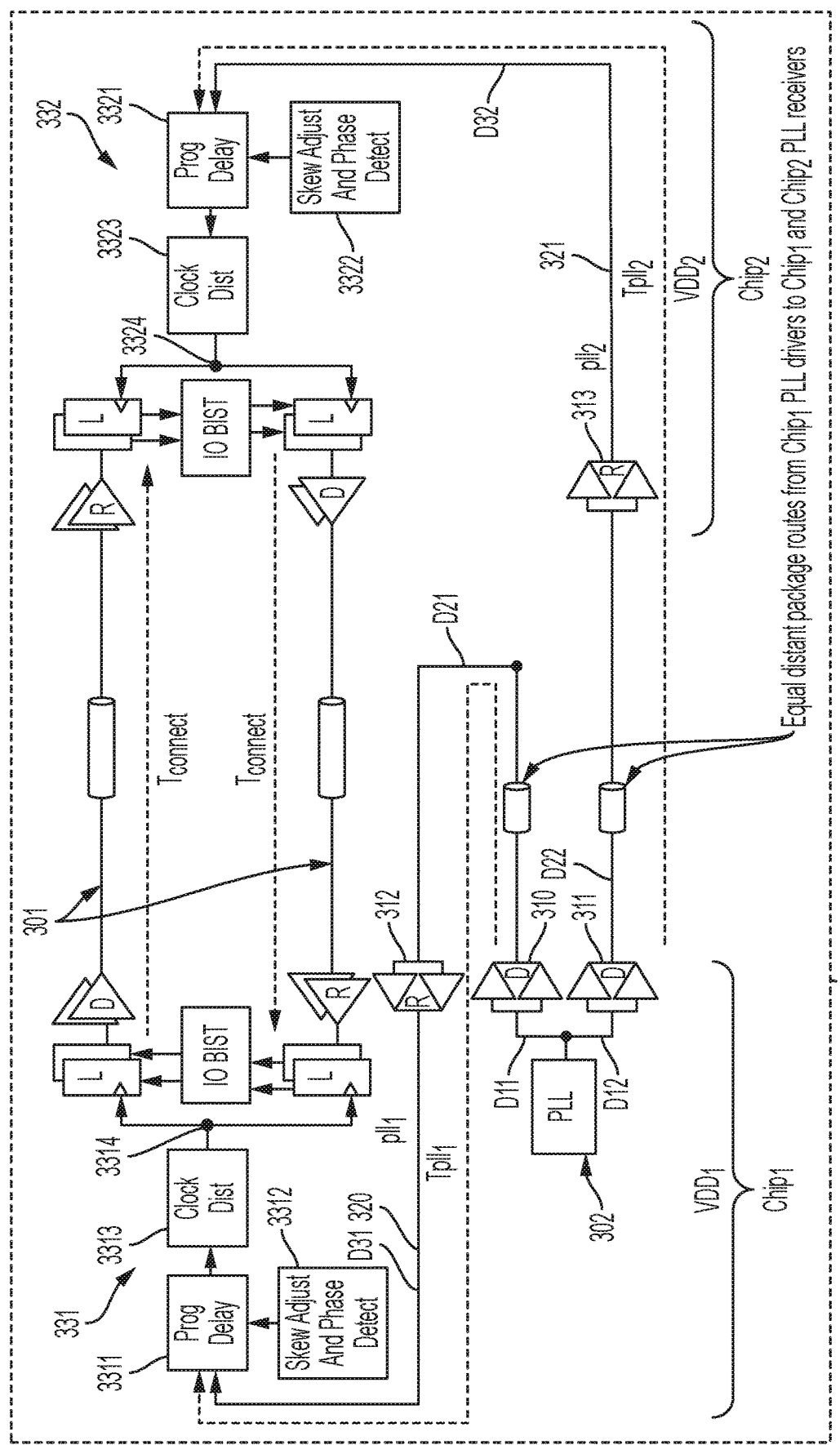
FIG. 3A is a schematic diagram of a two-chip die module with a single PLL in accordance with one or more embodiments of the present invention.
Figure 3B:
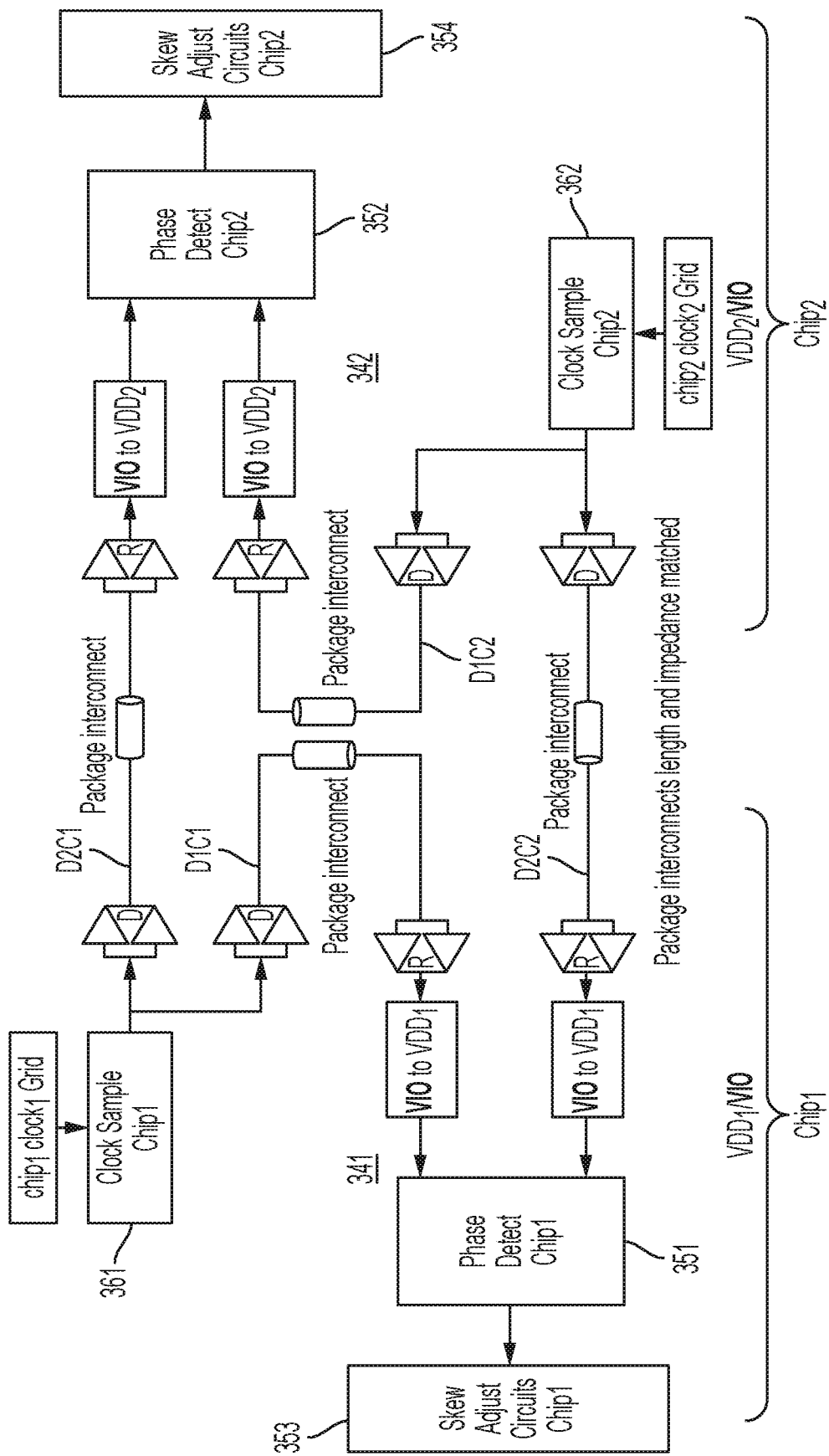
FIG. 3B is a schematic diagram of an interconnect topology of the a two-chip die module of FIG. 3A in accordance with one or more embodiments of the present invention.
Figure 3C:
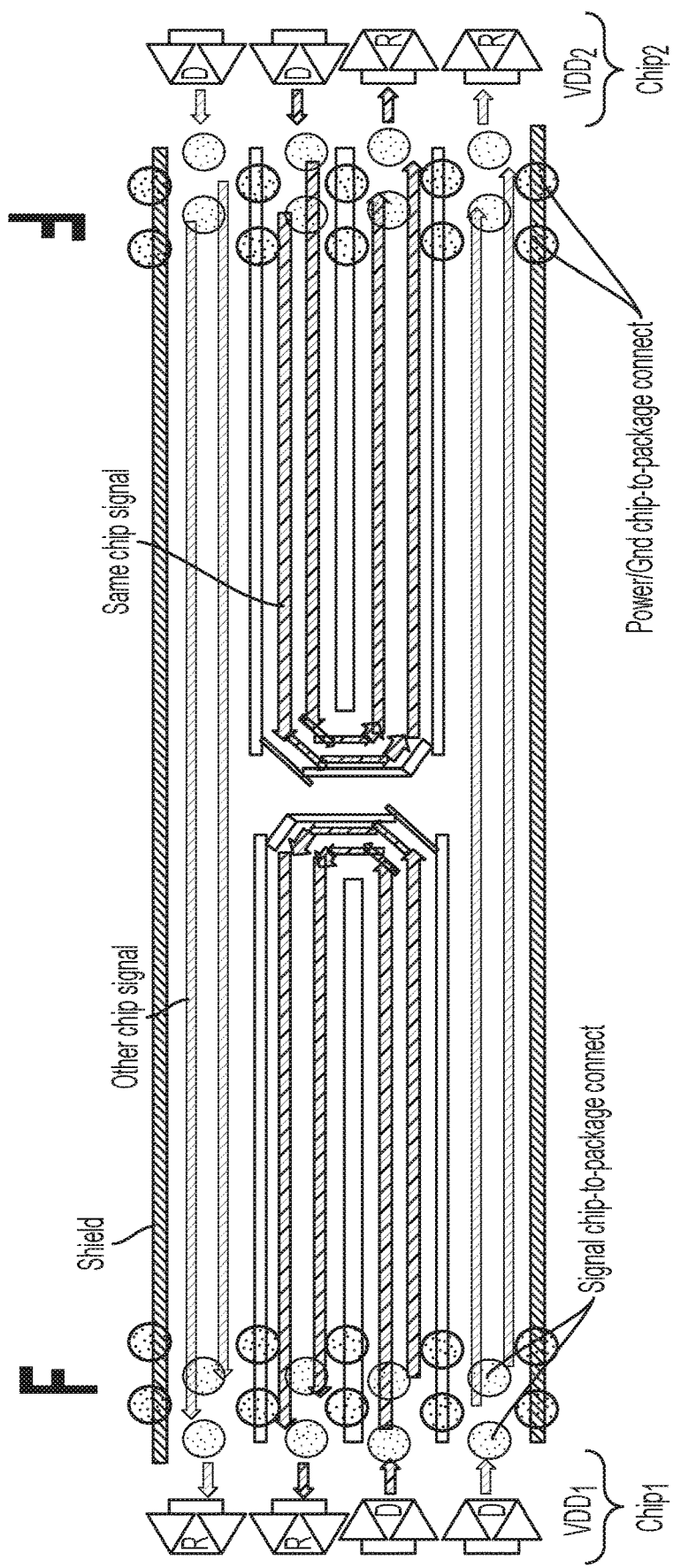
FIG. 3C is a schematic diagram illustrating that package interconnects for clock sample signals are laid in the topology of FIG. 3B to maintain minimal delay differences in accordance with one or more embodiments of the present invention.

With reference to FIGS. 3A-3C, configurations of a two-chip die module will now be described.

FIG. 3A shows a functional block diagram of chip-to-chip parallel interconnects 301 along with a single PLL 302 on chip1 as a source for a common clock signal for both chip1 and chip2 of a substrate 300 of a two-chip die module on which chip1 and chip2 are operably disposed. Having a single PLL 302 driving both clock distributions is crucial to eliminating static phase error and PLL-to-PLL drift. This deviates from conventional synchronous clocking configurations in which each chip uses its own PLL driven from a common reference clock to source its clock distribution. The single PLL is disposed within one of chip1 and chip2 to provide the source for the common clock signal for chip1 and chip2 with PLL signals of the single PLL to chip1 and chip2 being equal or nearly equal and with clock sample signals of chip1 and chip2 being equal or nearly equal.

As used herein, the phrase equal or nearly equal as it pertains to the PLL signals refers to the PLL signals traveling equal or nearly equal distances from the single PLL to chip1 and chip2 with the understanding that microscopic differences in the structures of the single PLL, chip1 and chip2 can lead to exceedingly small differences in the travel distances and travel times. These small differences are accounted for in the clock calibration methods described herein. Likewise, the phrase equal or nearly equal as it pertains to the clock sample signals refers to the clock sample signals traveling equal or nearly equal distances between chip1 and chip2 with the understanding that microscopic differences in the structures of chip1 and chip2 can lead to exceedingly small differences in the travel distances and travel times. As above, these small differences are accounted for in the clock calibration methods described herein.

As shown in FIG. 3A, the PLL differential output package interconnects are balanced to minimize any significant differences between delays Tpll1 and Tpll2. The PLL output on chip1 is routed from two differential drivers 310, 311 to differential receiver 312 on chip1 and to differential receiver 313 on chip2. The package routes 320 and 321 for the PLL output signal will be matched for impedance and delay to the differential receivers 312 and 313 on each of chip1 and chip2.

While there will be some asymmetries between chip1 and chip2 that are somewhat unavoidable, such as nanoscale differences in dimensions of various chip components, the placements of high-speed data drivers and receivers on chip1 and chip2 along with interconnect wiring will be laid out in such a manner as to provide for parallel communication and to minimize delay differences among the high-speed interconnects (see, upper Tconnect disposed in parallel with lower Tconnect in FIG. 3A).

In accordance with embodiments, a distance D11 is provided between the PLL 302 to the differential driver 310 of chip1, a distance D21 is provided between the differential driver 310 to the differential receiver 312 of chip1 and a distance D31 is provided between the differential receiver 312 and the clocking logic assembly 331 of chip1. The clocking logic assembly 331 of chip1 includes a program delay unit 3311, a skew adjust and phase detect unit 3312 that provides an input to the program delay unit 3311 and a clock distribution unit 3313 that receives an output from the program delay unit 3311 and thus generates an output for a clock sample point of the clock1 3314 of chip1. The total distance, DT1, that a clock signal travels along chip1 from the PLL 302 to the clocking logic assembly 331 of chip1 is equal to or very nearly equal to the sum of D11, D21 and D31. A distance D12 is provided between the PLL 302 to the differential driver 311 of chip2, a distance D22 is provided between the differential driver 311 to the differential receiver 313 of chip2 and a distance D32 is provided between the differential receiver 313 and the clocking logic assembly 332 of chip2. The clocking logic assembly 332 of chip 2 includes a program delay unit 3321, a skew adjust and phase detect unit 3322 that provides an input to the program delay unit 3321 and a clock distribution unit 3323 that receives an output from the program delay unit 3321 and thus generates an output for a clock sample point of the clock2 3324 of chip2. The total distance, DT2, that a clock signal travels along chip2 from the PLL 302 to the clocking logic assembly 332 of chip2 is equal to or very nearly equal to the sum of D12, D22 and D32.

The total distances DT1 and DT2 are equal or very nearly equal.

The program delay units 3311 and 3321 can be provided as clock distribution programmable delay logic and are fed from the PLL 302 (see pll1 and pll2). The program delay units 3311 and 3321 can each include an internal voltage regulator to minimize effects of power supply variations. The skew adjust and phase detect units 3312 and 3322 each employ shift register techniques to allow observation of clock edges.

As shown in FIG. 3B, interconnect topologies 341 and 342 are provided between the phase detect circuits 351 and 352 (which can be components of the skew adjust and phase detect units 3312 and 3322 of FIG. 3A) on both chip1 and chip2 and their own chip and other chip clock sample circuits 361 and 362. The phase detect circuits 351 and 352 compare the clock grid phase timing of each of chip1 and chip2 while in communication with the skew adjust circuits 353 and 354 (which can also be components of the skew adjust and phase detect units 3312 and 3322 of FIG. 3A). This is done after the clock sample signals are converted from the VIO input/output (I/O) voltage supply back to the chip-native VDD supplies VDD1 and VDD2. Either of chip1 and chip2 can have its skew adjust and phase detect units 3312 and 3322 programmed to affect the program delay units 3311 and 3321 (see FIG. 3A). Like the PLL signals in FIG. 3A, the package interconnects for the clock sample signals are laid to maintain minimal delay differences.

That is, the distance D1C1 a signal travels from a clock sample unit of chip1 to the phase detect circuit 351 and the skew adjust circuit 353 of chip1 is equal to or nearly equal to the distance D1C2 that a signal travels from a clock sample unit of chip2 to the phase detect circuit 352 and the skew adjust circuit 354 of chip2. Likewise, the distance D2C1 a signal travels from the clock sample unit of chip1 to the phase detect circuit 352 and the skew adjust circuit 354 of chip2 is equal to or nearly equal to the distance D2C2 that a signal travels from the clock sample unit of chip2 to the phase detect circuit 351 and the skew adjust circuit 353 of chip1.

The configurations described above are shown in the schematic representation of FIG. 3C. The chip-to-chip and same chip-to-same chip package signals are length matched in order to make the delay from chip1 to chip2 and vice versa as equivalent as possible physically. This helps the circuits of FIG. 3A track chip-to-chip delays in a controlled fashion (more so than in conventional configurations). Also, since noise in the package environment can add unwanted delays in the signal to package interconnect, the shield lines in FIG. 3C are added to avoid noise coupling between groups of signals that can possibly influence the delay matches between chip1 and chip2.

Figure 4:
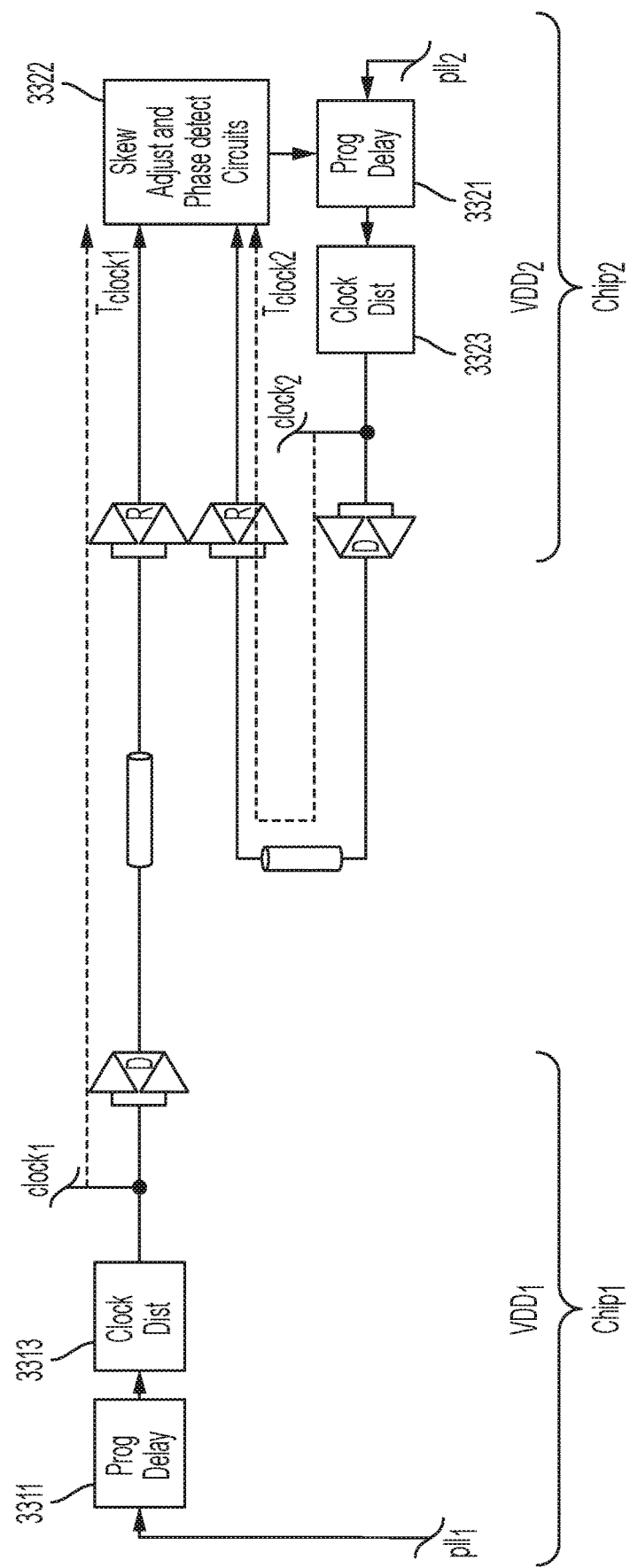
FIG. 4 is a schematic illustration of clock calibration operations in accordance with one or more embodiments of the present invention.
Figure 5:
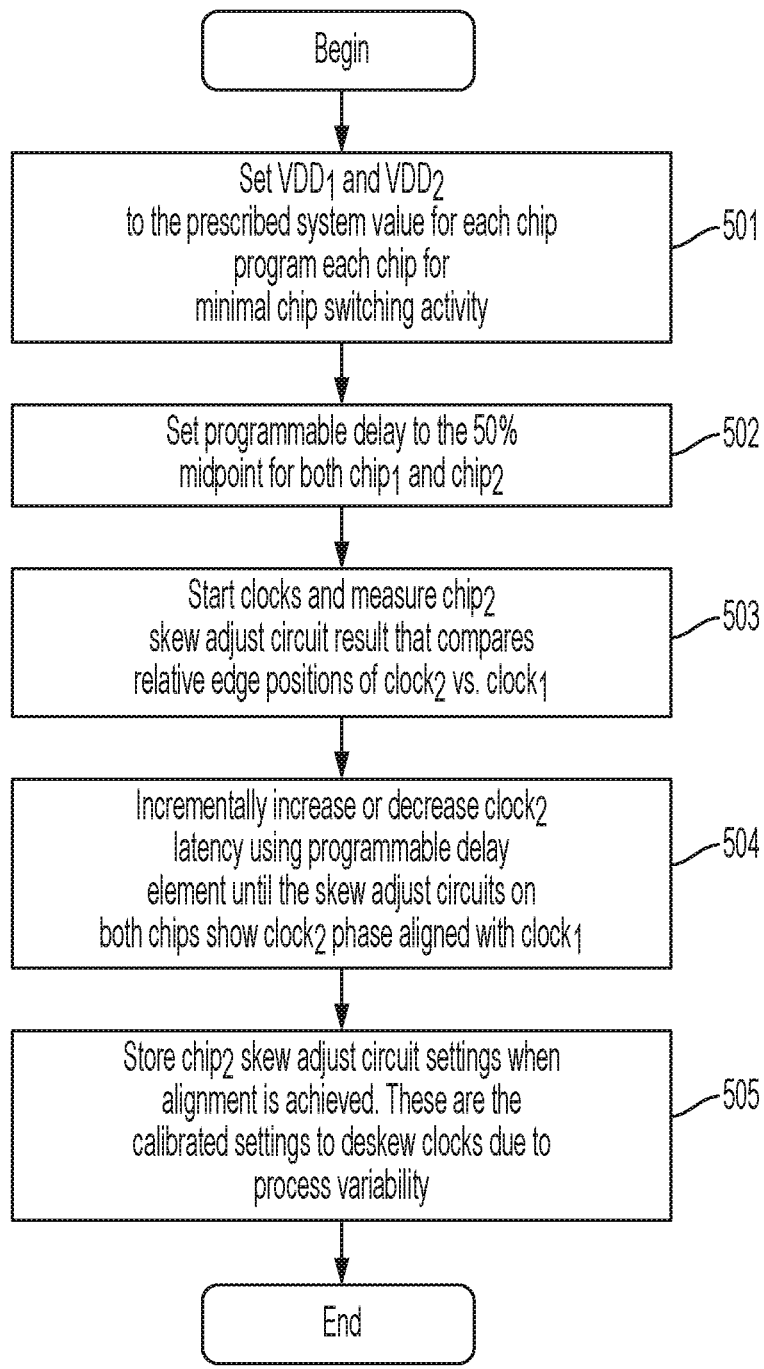
FIG. 5 is a flow diagram illustrating a method of clock calibration in accordance with one or more embodiments of the present invention.

With reference to FIGS. 4 and 5, clock calibration in accordance with one or more embodiments of the present invention will now be described. As a general matter, clock calibration can be done in two-phases or operations. The first addresses clock latency deltas due to chip process and setpoint voltage differences as well as package signal delay asymmetries. This is followed by an assessment of chip-to-chip interconnection latch timing margins across full bus widths due to power supply variations.

As shown in FIGS. 4 and 5, the first clock calibration phase is provided using static calibration methods to null out clock skew differences between both chip1 and chip2. A terminal voltage (VDD) for both chip1 and chip2 will be set to VDD1 and VDD2 chip1 and chip2 will be programmed to run with minimal switching activity eliminating any appreciable mid-frequency power supply variations and noise thus effectively isolating any clock distribution latency differences to chip process and package. Chip and package layouts will be arranged to assure virtually equal delays between Tclock1 and Tclock2 from each clock sample point clock1 and clock2 to the skew adjust and phase detect unit 3322 of chip2. After setting the programmable delay circuits on both chips to their 50% mid-points, the chip2 programmable delay will be incrementally adjusted through the skew adjust and phase detect unit 3322 until clock2 is phase aligned with clock1. The deskew settings will be stored and incorporated into the clock startup procedure effectively calibrating and aligning clock2 to clock1 during the module package power up procedure.

In greater detail, as shown in FIG. 5 in particular, the first clock calibration phase includes a setting of VDD1 and VDD2 to a prescribed system value for each chip and a programming of each chip for minimal chip switching activity (501). As used herein, minimal chip switching activity can refer to zero chip switching activity or a level of chip switching activity that does not lead to or cause noise disruptions of the clock calibration method described herein. The first clock calibration phase further includes a setting of a programmable delay to a predefined value (e.g., 50% midpoint) for both chip1 and chip2 (502) as well as a starting of clocks and a measuring of a chip2 skew adjust circuit result that compares relative edge positions of clock1 and clock2 (503). At this point, the first clock calibration phase includes incrementally increasing or decreasing clock2 latency using a programmable delay element until the skew adjust circuits on both chip1 and chip2 show that clock2 is phase aligned with clock1 (504). When alignment is achieved, the chip2 skew adjust circuit settings are stored as calibrated settings to deskew clocks due to process variability (505).

Figure 6:
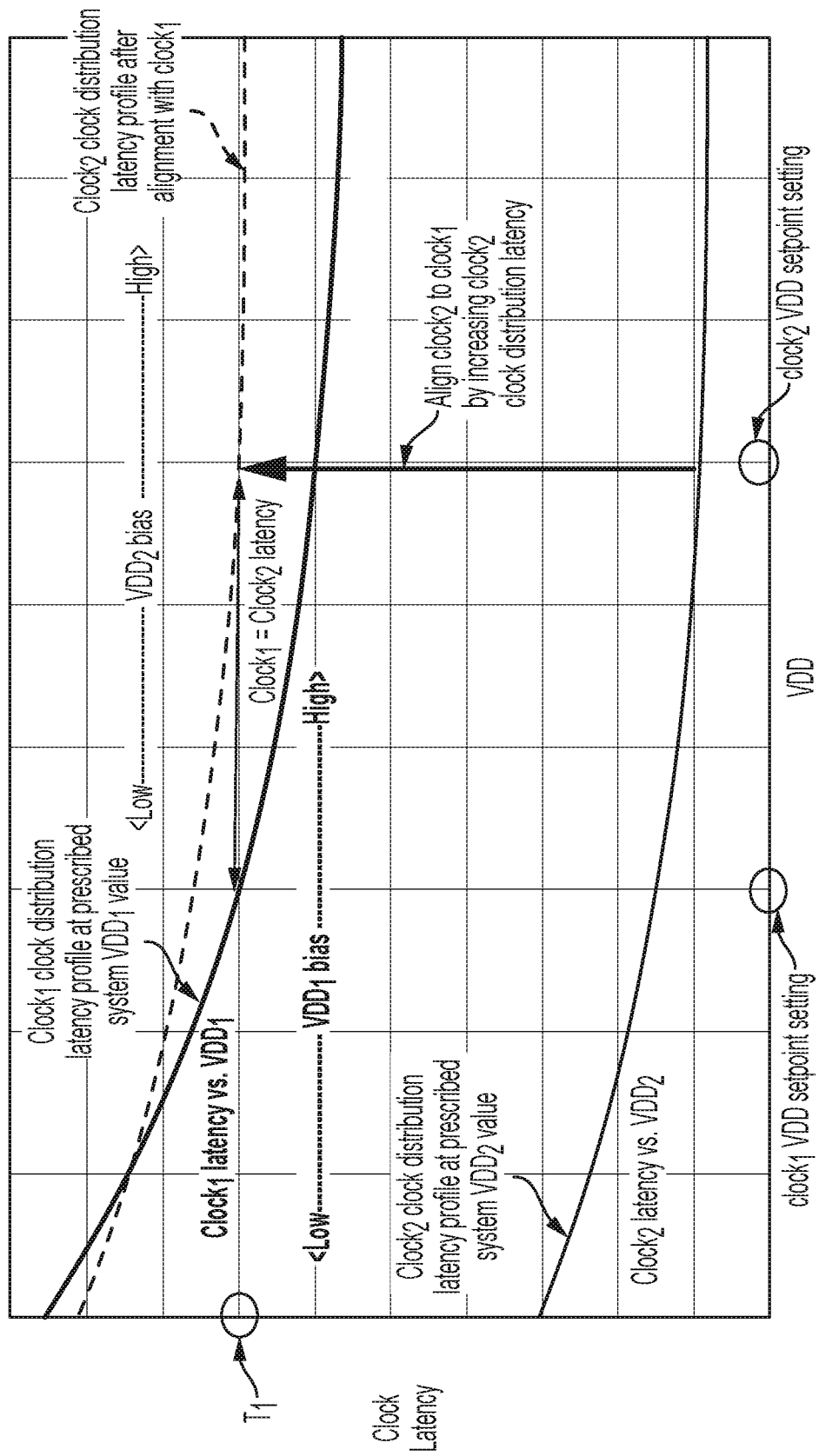
FIG. 6 is a graphical display of clock distribution latency versus VDD for two chips representing slow and fast process profiles in accordance with one or more embodiments of the present invention.

With reference to FIG. 6, an example of clock distribution latency vs. VDD for a two-chip die module is illustrated to represent slow and fast process profiles. FIG. 6 shows that the alignment of chip2, which has the faster clock latency, to chip1 can be achieved by increasing a clock distribution latency of chip2 at its prescribed VDD setpoint setting to thereby match a clock distribution latency T1 of chip1. This sets up the second phase of the calibration process.

Figure 7:
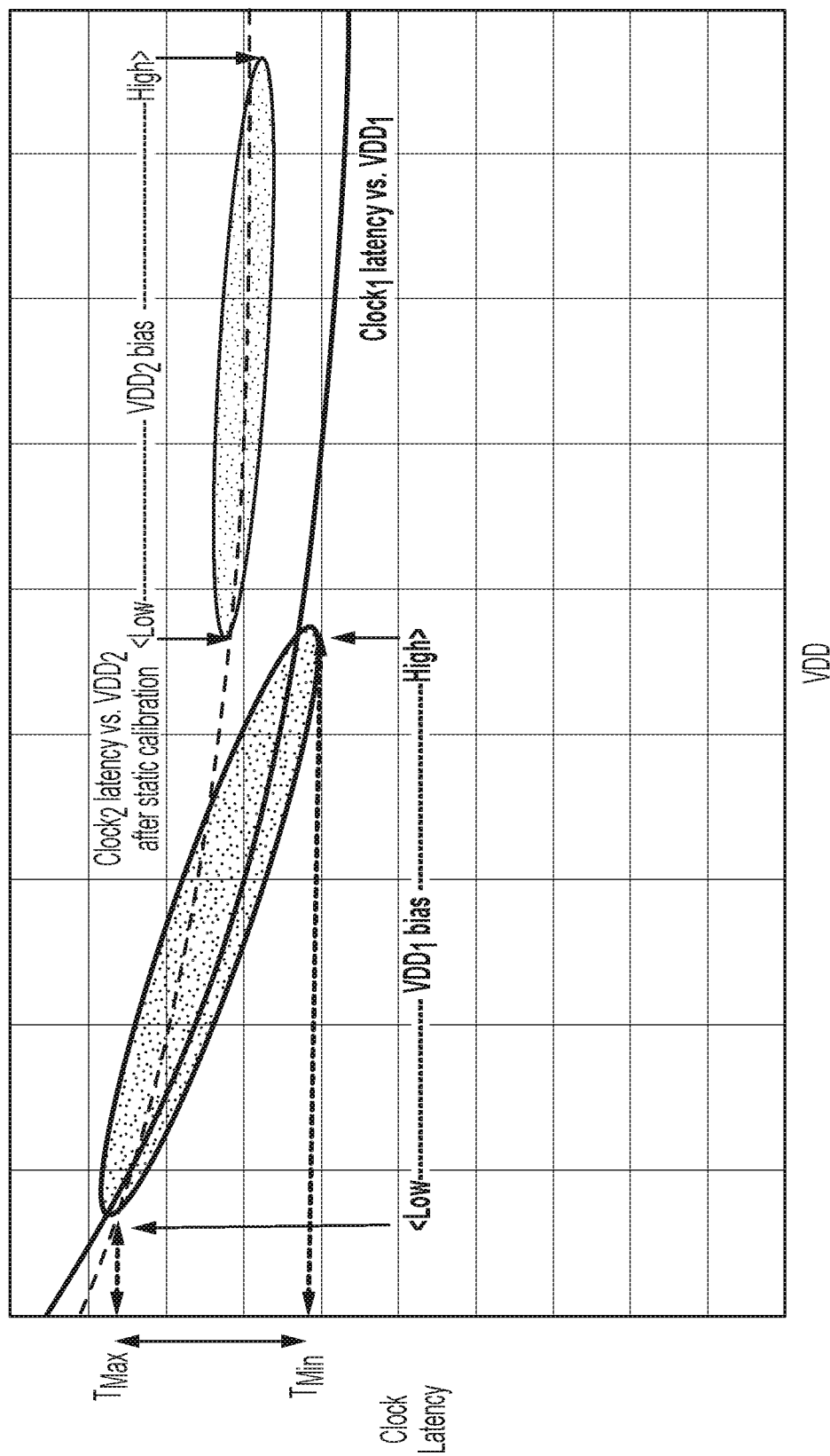
FIG. 7 is a graphical illustration of a method of addressing incremental variations of clock latencies of both chips of a two-chip die module in accordance with one or more embodiments of the present invention.

With reference to FIG. 7, it is to be understood that, in most chip pairing cases, performing the single static calibration step described above will suffice for chip-to-chip clock grid alignment. In the event of mid-frequency power supply noise variations that arise due to both chips executing independent workloads, a second phase of the calibration procedure could be followed that allows for real-time clock latency control. As a result of mid-frequency power supply noise variations, clock latencies on both chips of a two-chip die module will vary incrementally following their respective latency profiles. This is shown in FIG. 7. The delay profiles for both chips as a function of VDD1 and VDD2 is illustrated by their respective shaded enclosures. VDD1 and VDD2 biases are shown with clock1 latency variability limits noted as TMin and TMax. These limits encompass any clock2 variations. In a case such as this, chip2 would periodically sample its clock phase vs. that of chip1 making appropriate programmable delay adjustments to align clock2 with clock1.

Figure 8:
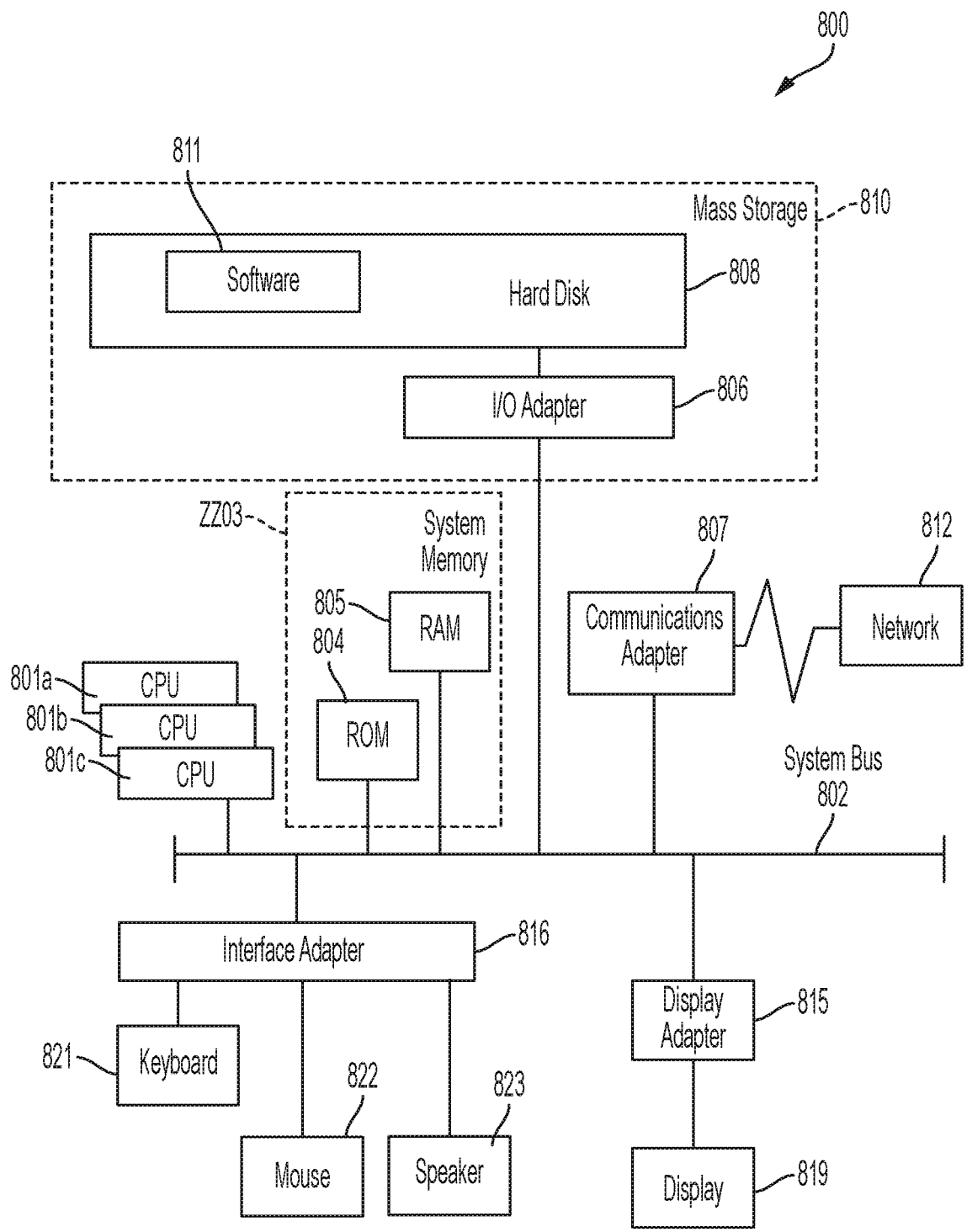
FIG. 8 is a schematic diagram of a computer system for executing a method of updating branch prediction in accordance with one or more embodiments of the present invention.

Turning now to FIG. 8, a computer system 800 is generally shown in accordance with an embodiment. The computer system 800 can be an electronic, computer framework comprising and/or employing any number and combination of computing devices and networks utilizing various communication technologies, as described herein. The computer system 800 can be easily scalable, extensible, and modular, with the ability to change to different services or reconfigure some features independently of others. The computer system 800 may be, for example, a server, desktop computer, laptop computer, tablet computer, or smartphone. In some examples, computer system 800 may be a cloud computing node. Computer system 800 may be described in the general context of computer system executable instructions, such as program modules, being executed by a computer system. Generally, program modules may include routines, programs, objects, components, logic, data structures, and so on that perform particular tasks or implement particular abstract data types. Computer system 800 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 8, the computer system 800 has one or more central processing units (CPU(s)) 801a, 801b, 801c, etc. (collectively or generically referred to as processor(s) 801). The processors 801 can be a single-core processor, multi-core processor, computing cluster, or any number of other configurations. The processors 801, also referred to as processing circuits, are coupled via a system bus 802 to a system memory 803 and various other components. The system memory 803 can include a read only memory (ROM) 804 and a random access memory (RAM) 805. The ROM 804 is coupled to the system bus 802 and may include a basic input/output system (BIOS), which controls certain basic functions of the computer system 800. The RAM is read-write memory coupled to the system bus 802 for use by the processors 801. The system memory 803 provides temporary memory space for operations of said instructions during operation. The system memory 803 can include random access memory (RAM), read only memory, flash memory, or any other suitable memory systems.

The computer system 800 comprises an input/output (I/O) adapter 806 and a communications adapter 807 coupled to the system bus 802. The I/O adapter 806 may be a small computer system interface (SCSI) adapter that communicates with a hard disk 808 and/or any other similar component. The I/O adapter 806 and the hard disk 808 are collectively referred to herein as a mass storage 810.

Software 811 for execution on the computer system 800 may be stored in the mass storage 810. The mass storage 810 is an example of a tangible storage medium readable by the processors 801, where the software 811 is stored as instructions for execution by the processors 801 to cause the computer system 800 to operate, such as is described herein below with respect to the various Figures. Examples of computer program product and the execution of such instruction is discussed herein in more detail. The communications adapter 807 interconnects the system bus 802 with a network 812, which may be an outside network, enabling the computer system 800 to communicate with other such systems. In one embodiment, a portion of the system memory 803 and the mass storage 810 collectively store an operating system, which may be any appropriate operating system, such as the z/OS or AIX operating system from IBM Corporation, to coordinate the functions of the various components shown in FIG. 8.

Additional input/output devices are shown as connected to the system bus 802 via a display adapter 815 and an interface adapter 816 and. In one embodiment, the adapters 806, 807, 815, and 816 may be connected to one or more I/O buses that are connected to the system bus 802 via an intermediate bus bridge (not shown). A display 819 (e.g., a screen or a display monitor) is connected to the system bus 802 by a display adapter 815, which may include a graphics controller to improve the performance of graphics intensive applications and a video controller. A keyboard 821, a mouse 822, a speaker 823, etc. can be interconnected to the system bus 802 via the interface adapter 816, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 8, the computer system 800 includes processing capability in the form of the processors 801, and, storage capability including the system memory 803 and the mass storage 810, input means such as the keyboard 821 and the mouse 822, and output capability including the speaker 823 and the display 819.

In some embodiments, the communications adapter 807 can transmit data using any suitable interface or protocol, such as the internet small computer system interface, among others. The network 812 may be a cellular network, a radio network, a wide area network (WAN), a local area network (LAN), or the Internet, among others. An external computing device may connect to the computer system 800 through the network 812. In some examples, an external computing device may be an external webserver or a cloud computing node.

It is to be understood that the block diagram of FIG. 8 is not intended to indicate that the computer system 800 is to include all of the components shown in FIG. 8. Rather, the computer system 800 can include any appropriate fewer or additional components not illustrated in FIG. 8 (e.g., additional memory components, embedded controllers, modules, additional network interfaces, etc.). Further, the embodiments described herein with respect to computer system 800 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 9:
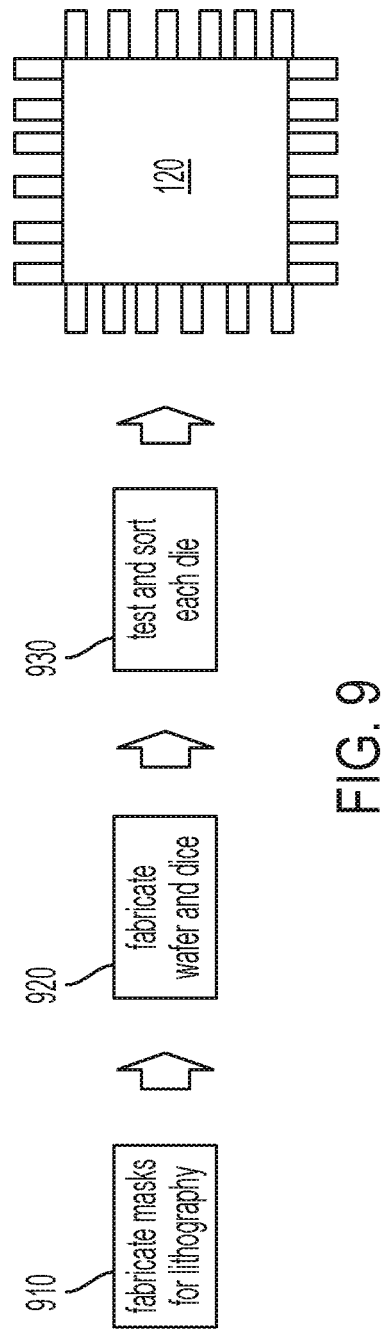
FIG. 9 is a process flow of a method of fabricating an integrated circuit according to exemplary embodiments of the invention.

FIG. 9 is a process flow of a method of fabricating an integrated circuit according to exemplary embodiments of the invention. Once the physical design data is obtained, based, in part, on the computer-implemented method of updating branch prediction described herein, the integrated circuit 120 can be fabricated according to known processes that are generally described with reference to FIG. 9. Generally, a wafer with multiple copies of the final design is fabricated and cut (i.e., diced) such that each die is one copy of the integrated circuit 120. At block 910, the processes include fabricating masks for lithography based on the finalized physical layout. At block 920, fabricating the wafer includes using the masks to perform photolithography and etching. Once the wafer is diced, testing and sorting each die is performed, at block 930, to filter out any faulty die.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method of clock calibration for each of a first chip and a second chip of a two-chip die module, the first chip comprising a clock distribution unit to generate an output for a clock sample point of the first chip and the second chip comprising a clock distribution unit to generate an output for a clock sample point of the second chip, the method comprising:
    arranging layouts of the first and second chips to provide equal delays between a skew adjust and phase detect unit of the second chip and the clock sample points of each of the first and second chips;
    setting a voltage signal to a prescribed value for each of the first and second chips;
    programming each of the first and second chips for minimal chip switching activity;
    setting a programmable delay to a predefined value for each of the first and second chips;

starting clocks on each of the first and second chips and measuring a skew of the second chip from a comparison of relative edge positions of the clock of each of the first and second chips;

incrementally adjusting a latency of the second chip until the skew of each of the first and second chips shows phase alignment of the clock of each of the first and second chips; and storing the skew of the second chip as a setting once the phase alignment is achieved.

2. The computer-implemented method according to claim 1, wherein the predefined value is a 50% midpoint for both of the first and second chips.

3. The computer-implemented method according to claim 1, wherein the incrementally adjusting of the latency of the second chip comprises increasing or decreasing the latency of the second chip.

4. The computer-implemented method according to claim 1, further comprising:

periodically sampling a clock phase of one of the first and second chips versus the clock phase of the other of the first and second chips; and making appropriate programmable delay adjustments to along the clock phase of the one of the first and second chips with the clock phase of the other of the first and second chips.

5. A computer program product for clock calibration for each of a first chip and a second chip of a two-chip die module, the first chip comprising a clock distribution unit to generate an output for a clock sample point of the first chip and the second chip comprising a clock distribution unit to generate an output for a clock sample point of the second chip, the computer program product comprising:

a computer-readable storage medium having program instructions embodied therewith, the program instructions executable by one or more processors to cause the one or more processors to perform a method comprising:

arranging layouts of the first and second chips to provide equal delays between a skew adjust and phase detect unit of the second chip and the clock sample points of each of the first and second chips;

setting a voltage signal to a prescribed value for each of the first and second chips;

programming each of the first and second chips for minimal chip switching activity;

setting a programmable delay to a predefined value for each of the first and second chips;

starting clocks on each of the first and second chips and measuring a skew of the second chips from a comparison of relative edge positions of the clock of each of the first and second chips;

incrementally adjusting a latency of the second chip until the skew of each of the first and second chips shows phase alignment of the clock of each of the first and second chips; and storing the skew of the second chip as a setting once the phase alignment is achieved.

6. The computer program product according to claim 5, wherein the predefined value is a 50% midpoint for both of the first and second chips.

7. The computer program product according to claim 5, wherein the incrementally adjusting of the latency of the second chip comprises increasing or decreasing the latency of the second chip.

8. The computer program product according to claim 5, wherein the method further comprises:

periodically sampling a clock phase of one of the first and second chips versus the clock phase of the other of the first and second chips; and making appropriate programmable delay adjustments to along the clock phase of the one of the first and second chips with the clock phase of the other of the first and second chips.

* * * * *